United States Patent [19]
Dammel et al.

[11] Patent Number: 5,614,351
[45] Date of Patent: Mar. 25, 1997

[54] RADIATION-CURABLE MIXTURE, AND RADIATION-SENSITIVE RECORDING MATERIAL PRODUCED THEREFROM FOR HIGH-ENERGY RADIATION

[75] Inventors: Ralph Dammel, Mainz-Bretzenheim; Juergen Lingnau, Mainz-Laubenheim; Georg Pawlowski, Wiesbaden; Juergen Theis, Frankfurt am Main, all of Germany

[73] Assignee: Hoechst Aktiengesellschaft, Frankfurt am Main, Germany

[21] Appl. No.: 491,813

[22] Filed: Mar. 12, 1990

[30] Foreign Application Priority Data

Mar. 11, 1989 [DE] Germany ............ 39 07 953.8

[51] Int. Cl.$^6$ ............ G03C 1/492; G03C 1/494; G03C 1/76; C08F 2/46
[52] U.S. Cl. ............ 430/270.1; 430/919; 430/920; 430/921; 430/925; 522/67
[58] Field of Search ............ 430/270, 270.1, 430/919, 920, 921, 925; 522/67

[56] References Cited

U.S. PATENT DOCUMENTS

| | | | |
|---|---|---|---|
| 3,615,455 | 10/1971 | Laridon et al. | 430/270 |
| 3,686,284 | 8/1972 | Rosenkranz et al. | 430/270 |
| 3,692,560 | 9/1972 | Rosenkranz et al. | 430/270 |
| 3,912,606 | 10/1975 | Pacifici et al. | 430/270 |
| 4,101,323 | 7/1978 | Buhr et al. | 96/35 |
| 4,189,323 | 2/1980 | Buhr | 430/281 |
| 4,193,799 | 3/1980 | Crivello | 430/270 |
| 4,247,611 | 1/1981 | Sander et al. | 430/286 |
| 4,289,845 | 9/1981 | Bowden et al. | 430/296 |
| 4,311,782 | 1/1982 | Buhr et al. | 430/270 |
| 4,398,001 | 8/1983 | Cheng et al. | 525/502 |
| 4,491,628 | 1/1985 | Ito et al. | 430/270 |
| 4,678,737 | 7/1987 | Schneller et al. | 430/270 |
| 4,699,289 | 8/1987 | Crivello | 430/270 |
| 4,699,867 | 10/1987 | Schneller . | |
| 4,916,046 | 4/1990 | Doessel | 430/270 |
| 5,217,843 | 6/1993 | Dammel et al. | 430/270.1 |
| 5,403,697 | 4/1995 | Doessel et al. | 430/270.1 |

FOREIGN PATENT DOCUMENTS

| | | |
|---|---|---|
| 0232972 | 12/1987 | European Pat. Off. . |
| 0164248 | 5/1995 | European Pat. Off. . |
| 2317846 | 10/1973 | Germany . |
| 3821585 | 3/1989 | Germany . |
| 1163324 | 9/1969 | United Kingdom . |

OTHER PUBLICATIONS

Crivello Polymer Engineering and Science, Dec. 1983 vol. 23, No. 17, pp. 953–956.

Burns et al, Microelectronic Engineering 6, 1987 pp. 467–471.

Taylor, "X–Ray Resist Trends," Solid State Technology, Jun. 1984, pp. 124–131.

Yamaoka et al., "Crosslinking of Polymers with Irradiating Rh, L∝X Ray—Effect of Active Groups and a Heavy Atom on Crosslinking," Society of Photographic Scientists and Engineers, Photographic Science and Engineering, vol. 23, No. 4, Jul./Aug. 1979, pp. 196–202.

Bowden et al., "A Sensitive Novolac–Based Positive Electron Resist," J. Electrochem. Soc.: Solid–State Science and Technology, Jun. 1981, pp. 1304–1313.

Bruns et al., "A Study of Catalytically Transformed Negative X–Ray Resists, Based on Aqueous Based Developable Resin, An Acid Generator and A Crosslinker," Microelectronic Engineering 6, 1987, pp. 467–471.

*Primary Examiner*—George F. Lesmes
*Assistant Examiner*—Bernard Codd
*Attorney, Agent, or Firm*—Foley & Lardner

[57] ABSTRACT

A radiation-curable mixture is disclosed which contains a compound which forms an acid under the action of high-energy radiation, and contains an acid-curable compound, wherein the compound which forms an acid contains aliphatically bound halogen (chlorine or bromine) and has a $pK_a$ value of less than about 12. A radiation-curable recording material and a process for recording high-energy radiation using the material are also disclosed. The mixture, and in particular the recording material produced therefrom, has relatively high sensitivity and improved resolution and, in addition, does not exhibit image fogging after development.

15 Claims, No Drawings

RADIATION-CURABLE MIXTURE, AND RADIATION-SENSITIVE RECORDING MATERIAL PRODUCED THEREFROM FOR HIGH-ENERGY RADIATION

BACKGROUND OF THE INVENTION

The invention relates to a negative radiation-curable mixture containing a compound which forms an acid under the action of high-energy radiation, and an acid-curable compound.

In classical UV lithography, the resolution limit is determined by the wavelength of the radiation used. The constant decrease in dimensions in chip production therefore requires new lithographic techniques in the submicron region, electron or X-ray radiation being employed due to its extremely short wavelength. At the same time, it has been shown that resist materials which are suitable as electron beam resist can also be employed as X-ray resist, and vice versa.

Known resist materials for this application are acrylates and methacrylates (G. M. Taylor, Solid State Technology, 124 (1984)). In the case of these materials, it has been shown that sensitivity and structural resolution are usually contrary properties. If it is to be possible for higher sensitivities to be achieved, halogens are usually incorporated into the resist. In this case, fluorine and chlorine are usually employed in positive resists, whereas it is usually bromine and iodine, besides chlorine, which are employed in negative resists (T. Yamaoka et al., Phot. Sci. Eng. 23, 196 (1979)).

In general, negative, i.e. radiation-curable, resists exhibit higher sensitivity than positive resists, but, in contrast, cannot simultaneously—as stated above—have a high resolution in the submicron region. On the other hand, positive methacrylate-based resists achieve high resolution, but, with the exception of polymethacrylonitrile-based resists, are not stable to the plasma etching processes used for semiconductor structuring. In turn, however, the methacrylate resists are not sufficiently sensitive.

The polymers having the highest radiation sensitivity known to date to electron beams or X-rays are polyalkene sulfones, in particular polybutene 1-sulfone. The disadvantage of this class of compounds is, however, that they are less resistant to plasma etching processes; they are therefore suitable for mask production, but not for semiconductor fabrication using a mask made of this material. It has therefore been proposed to combine polyalkene sulfones with novolak resins, which, as is generally known, are resistant to plasma etching (M. J. Bowden et al., J. Electrochem. Soc. 128, 1304 (1981); U.S. Pat. No. 4,289,845). However, it became apparent that the two polymers are extremely incompatible with one another, thus impairing the resolution. An attempt to improve the compatibility by admixing further components also had to pay the price of loss in sensitivity (U.S. Pat. No. 4,398,001).

In order to retain high sensitivities at the same time as an improved overall property profile, in particular improved plasma-etching resistance, photocatalytic resists have been developed. Examples of positive systems of this type are described in, inter alia, DE-A-2,718,254 (=U.S. Pat. No. 4,247,611) and 2,928,636 (=U.S. Pat. No. 4,311,782), and the earlier German Patent Applications P 37 30 784.3 and P 38 21 585.3.

Corresponding negative systems are, for example, resists which dimerize with crosslinking on irradiation, such as cinnamic acid derivatives, which are polymerically bound, and polyacrylates. Resists of this type are relatively insensitive. If the principle of photocatalysis is used in negative systems, distinction is made between resists which can be photopolymerized by means of free radicals and resists in which crosslinking occurs cationically by addition, substitution or condensation as a result of photoinduced reactions. The former have considerable disadvantages with respect to the imaging quality. They are therefore only of limited suitability for applications in the submicron region.

The use of acid-curable resins in photoresist formulations is long known. Thus, for example, U.S. Pat. No. 3,692,560 discloses that halogen-containing benzophenones in combination with melamine resins or urea-formaldehyde resins can be employed as UV resists. DE-A-2,718,259 (=U.S. Pat. No. 4,189,323) describes the use of halogenated derivatives of s-triazine as photolytically activatable acid donors for positive and negative systems, for example for acid-curable urea-formaldehyde, melamine-formaldehyde and phenol-formaldehyde resins (column 5). Examples of formulations of this type are also given in Vollenbroek et al, Microelectronic Engineering 6, 467 (1987).

Photolytically activatable acid formers which can be used also include onium salts, such as diphenyliodonium salts of non-nucleophilic acids, for example of $HSbF_6$, $HAsF_6$ or $HPF_6$. DE-A 2,730,725 (=U.S. Pat. No. 4,193,799) outlines the use of initiators of this type in resist formulations with epoxides as acid-curable materials. A general overview on the use of onium salts in acid-curable systems is given in J. V. Crivello, Polym. Eng. Sci. 23, 953 (1983).

EP-A-0,164,248 describes photocurable mixtures based on acid-curable resins and diazonaphthoquinones or o-nitrobenzoic acid derivatives.

The use of halogenated compounds, such as DDT or gammexan, which are virtually non-absorbent above 299 nm, as photoinitiators in acid-curable negative photoresists is described in EP-A-0,232,972.

Chlorine- and bromine-containing compounds in photosensitive materials also include hexabromodimethyl sulfoxide in photographic materials (DE-A 1,572,089=GB-A 1,163,324), 2,2-dibromo-2-(phenylsulfonyl)acetophenone and related compounds as polymerization initiators (DE-A 1,817,540=U.S. Pat. No. 3,615,455), trichloromethyl-substituted benzophenones as polymerization initiators (DE-A-1, 949,010=U.S. Pat. No. 3,686,084), haloalkylbenzoxazoles, -benzimidazoles and -benzothiazoles as polymerization initiators (U.S. Pat. No. 3,912,606) and side group-halogenated acetophenones as photocatalysts for acid-curable surface coatings (DE-A 2,317,846).

It is common to the systems described that the initiator compounds do not participate in the actual crosslinking and that—with the exception of the onium salts—they are not soluble in the aqueous alkaline developers themselves. This results in drastically reduced development rates at the points at which the developer is intended to remove the unexposed resist layer. The amount of initiator compound which can be added—and thus the sensitivity of the finished resist—is thereby significantly limited. The use of onium salts, including the initiators described in EP-A-0,232,972 and known as crop-protection agents, is, in addition, also unacceptable for physiological reasons.

It has therefore been proposed, in accordance with the earlier German Patent Application P 38 21 585.3, to use, as alkali-soluble initiator compounds, compounds containing aromatically bound chlorine or bromine which have a $pK_a$ value of less than 12. Although the compounds mentioned exhibit good sensitivities on irradiation with synchrotron radiation, the sensitivities which can be achieved using them on irradiation with UV radiation are, however, relatively low.

SUMMARY OF THE INVENTION

Accordingly, it is an object of the present invention to provide a negative resist system for recording high-energy radiation, which has high sensitivity to high-energy radiation, such as electron or X-ray radiation, and especially to short-wave UV radiation.

Another object of the present invention is to provide a negative resist system which gives high resolution resist structures after development with an aqueous alkaline developer, is physiologically acceptable and has good resistance to liquid and plasma-etching media.

Yet another object of the present invention is to provide an improved radiation-curable recording material.

A further object of the present invention is to provide an improved process for recording high-energy radiation.

In accomplishing the foregoing objectives, there has been provided, in accordance with one aspect of the present invention, a radiation-curable mixture which can be cured by means of high-energy radiation, which comprises a compound which forms an acid under the action of high-energy radiation, and an acid-curable substance, wherein the compound which forms an acid contains at least one aliphatically bound halogen atom and has a $pK_a$ value of less than about 12.

In accordance with another aspect of the present invention there is provided a radiation-curable recording material which comprises a substrate and a radiation-sensitive coating comprising a radiation-curable mixture as described above.

In accordance with still another aspect of the present invention, there is provided a process for recording high-energy radiation which comprises the steps of applying a coating comprising the foregoing radiation-curable mixture to a substrate to form a radiation-curable recording material, drying the material, irradiating the material imagewise with high-energy radiation, and developing the resultant image by removing the non-irradiated areas of the coating using an aqueous alkaline developer.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

It was surprising that the use of initiators of this type also gives acid-curable mixtures of particularly high sensitivity without the development behavior or the thermal stability of the resist structures obtained being adversely affected by the high initiator concentrations necessary, as is the case when the initiators described in EP-A-0,232,972 are used. This is attributable to the fact that, due to the initiator structure, the alkali solubility of the unexposed resist areas is significantly increased. By contrast, the initiator partially participates in the crosslinking reaction at the exposed points of the resist.

Of the acid-forming initiators containing aliphatically bound chlorine or bromine, those are preferred which have a $pK_a$ value in the range 6 to 10.

The $pK_a$ value of chemical compounds can be determined by customary methods, but theoretical calculation using, for example, the "CAMEO" program is also possible.

In general, the initiator compounds comprise a group containing aliphatically bound chlorine or bromine and a functional group which determines the $pK_a$ value necessary.

Suitable functional groups which give such a $PK_a$ value are, in particular: phenolic OH groups, aliphatic OH groups with strongly electron-attracting substituents in the vicinity, aromatic SH groups, aliphatic or aromatic sulfonamide groups, aliphatic or aromatic imide groups, N-acyl-substituted carbamate groups or carbamide groups, nitro-substituted alkyl groups or other CH-acidic functional groups, for example those with carbonyl, cyano or carboxylate groups in the vicinity. At least one of these groups is present per compound.

Suitable substituents for the N-acyl-substituted carbamate or carbamide groups are alkyl or aryl groups, in particular those having 2 to 6 carbon atoms. $(C_2-C_3)$alkyl groups and phenyl groups, which may in each case themselves be substituted, in particular by hydroxyl, are particularly preferred. In these cases, the hydroxyl group is localized in particular in the ω-position as a substituent of an alkyl radical and in particular in the 4-position as a substituent of a phenyl radical.

In a particular variant, the optionally OH-substituted aryl groups occur as substituents of an N-acyl-substituted carbamate, while the optionally OH-substituted alkyl groups occur as substituents, in particular, of an N-acyl-substituted carbamide.

CH-acidic functional groups which may be mentioned in particular are β-diketone or β-ketoester groups. In the case of the esters, alkyl esters, in particular the methyl or ethyl esters, are preferred. The β-diketone units may be substituted in an α-position relative to the carbonyl groups, in particular by phenyl or methyl.

Of the functional groups mentioned which determine the $pK_a$ value necessary, in particular one is present per initiator molecule. However, in the case of N-acyl-substituted carbamates, a hydroxy-phenyl group may additionally be present in the molecule, in particular as a substituent of the nitrogen atom.

Preferred functional groups which are able to produce the $pK_a$ value necessary are phenolic OH groups, imide groups, N-acyl-substituted carbamate or carbamide groups or CH-acidic functional groups.

Imide groups, N-acyl-substituted carbamate or carbamide groups or CH-acidic functional groups are particularly preferred.

The halogen-containing functional group can contain the bromine or chlorine required in any aliphatically bound form. The halogen here may be bound to an $sp^3$-, $sp^2$- or sp-hybridized carbon atom. Halogen bound to an $sp^3$-hybridized carbon atom is preferred.

Due to their thermal stability, compounds in which elimination of hydrogen halide is only possible with difficulty or not at all, due to the molecular structure, are preferred. Compounds which may be mentioned are those which do not have hydrogen atoms in the α-position relative to the halogen substituents, such as, for example, trichloro-methylcarbonyl- or 2,2,2-trichloro-1,1-difluoroethyl- or 2,2,2-trichloro-tert.butyl-substituted or correspondingly lower halogenated functional groups.

The trihalomethylcarbonyl, trihalomethyl, monohalomethylcarbonyl, monohalomethyl and 2,2,2-trihalo-tert.butyl groups are preferred. The trichloromethylcarbonyl groups, monobromomethylcarbonyl groups and trichloromethyl groups are particularly preferred.

in case of a CH-acidic compound, the halogen may also be bound to the carbon atom to which the acidic H atom is attached. This applies, in particular, to the halogen chlorine and in a β-ketoester. Likewise, the halogen, in particular as a trihalomethyl or monohalomethyl group, can be bound to the carbonyl group in the β-diketone or β-ketoester.

Alternatively, functional groups in which elimination of hydrogen halide is not possible due to the steric arrangement are also suitable, for example in gammexyl (all-trans-hexachlorocyclohexyl), i.e. the α-carbon atom has no hydrogen atoms in the trans-position to the halogen atom.

In addition to these aliphatically bound halogen atoms, aromatically bound halogen atoms may also be present in the molecule. Molecular structures which are additionally chlorinated or brominated in the o,o-position to a phenolic OH group have proven particularly suitable.

In the initiators present in the radiation-sensitive mixture according to the invention, the halogen-containing functional groups are preferably linked by a single bond to the functional groups by which the $pK_a$ value of the compound is determined.

However, this is not applicable to polymeric initiator compounds, in particular homopolymers or copolymers containing vinylphenol units.

In the case of copolymers, the halogen, in particular chlorine, is bound via the comonomer. Vinyl chlorides, vinyl bromides, allyl halides, halogen-containing vinyl esters and halogen-containing esters of acrylic or methacrylic acid may preferably be mentioned.

In the case of homopolymers, individual hydroxyl groups, in particular, of the hydroxyphenol units form esters with trihalomethylcarbonyl groups. Every 2nd to 5th hydroxyphenol unit in the polymer is preferably reacted in this way.

In both homopolymers and copolymers, chlorine or bromine may, in addition to or instead of the above positions, be present in the o,o-position to the phenol group. However, this embodiment is net preferred.

The polymers mentioned each contain on average, in particular, one halogen-containing group and one group capable of modifying the $pK_a$ value per unit. The compounds have a molecular weight in the range from about 2,000 to 100,000.

The initiators present in the radiation-sensitive mixture according to the invention may be used alone or in combination with other initiators of the class mentioned. However, combinations with other initiators are also possible.

These include diazonium, phosphonium, sulfonium and iodonium salts, halogen compounds, diazo-o-quinone sulfochlorides and -esters, and organometallic/organohalogen combinations (cf. DE-A-3,601,264).

The halogen compounds include, in particular, triazine derivatives, which are known from U.S. Pat. Nos. 3,515,552, 3,536,489 and 3,779,778, and DE-C-2,718,259, 3,337,024, 3,333,450, 2,306,248, 2,243,621 and 1,298,414.

It is also possible to use oxazoles, oxadiazoles, thiazole or 2-pyrones containing trichloromethyl or tribromomethyl groups in a mixture with the initiators mentioned (DE-A-3, 021,599, 3,021,590, 2,851,472 and 2,949,396 and EP-A-0, 135,348 and 0,135,863).

Besides these, the potential coinitiator compounds also include aromatic compounds containing a ring-bound halogen, preferably bromine. Such compounds are known from DE-A-2,610,842 and the earlier German Patent Applications P 37 30 784.3 and 38 21 585.3.

A representative of a combination with a thiazole which may be mentioned is 2-benzoylmethylene-naphtho[1,2-α] thiazole (DE-A-2,851,641 and DE-A-2,934,758).

α-Halocarboxamides (DE-A-2,718,200) or tribromomethyl phenyl sulfones (DE-A-3,503,113), which may be sensitized, for example, by means of benzophenone, benzil or Michler's ketone, are also available as coinitiators in an initiator combination.

The coinitiators mentioned may be present with the initiators containing aliphatically bound halogen in any mixing ratio in the radiation-sensitive mixture according to the invention, but with the proviso that the initiator combination has, as a mixture, a $pK_a$ value of less than about 12, in particular of 6 to 10.

The total content of initiator compounds in the radiation-sensitive mixture according to the invention is in general about 0.5 to 50% by weight, preferably 2 to 25% by weight, in each case based on the total weight of the coating.

Suitable systems which can be cured catalytically by means of acid are crosslinkable systems in which the crosslinker component and the crosslinkable functional group which reacts with the latter are present in one and the same molecule, preferably an oligomer or polymer molecule. Examples are copolymers of N-alkoxymethyl methacrylamide with, for example, acrylic acid or pyrocatechol monomethacrylate, if appropriate in the presence of further comonomers, as described in EP-A-0,184,044.

Suitable acid-curable components are furthermore compounds which contain cationically polymerizable groups. Examples which may be mentioned are vinyl ethers, epoxides, and others. An overview can be found in Makromol. Chemie, Macromolecular Symposia, Vol. 13/14, Munich 1988. Compounds of this type in which several of the groups mentioned are present are preferred.

Furthermore, suitable acid-curable components are compounds which undergo acid-catalyzed condensation reactions with themselves or with the binder. Examples which may be mentioned here are melamine-formaldehyde resins, benzoguanamine-formaldehyde resins, glycoluril-formaldehyde resins, urea-formaldehyde resins, but also hydroxymethylated phenols and cresols, as described, for example, in EP-A-0,212,482.

Preferred mixtures are those in which the reacting groups are distributed over various molecules. In one such case, the binder contains a crosslinkable functional group. Suitable crosslinkable functional groups are —SH, —OH, —CONH$_2$ and —COOH groups. Furthermore, suitable mixtures are those which can be cured by condensation with formaldehyde in the presence of acid. These include, in particular, appropriately substituted phenolic resins. In place of formaldehyde, compounds can be employed which liberate formaldehyde, for example trioxane. These are preferably used in combination with phenolic resins.

Besides the binders mentioned, which participate directly in the acid-catalyzed crosslinking reaction, it is also possible to employ binders which serve exclusively as an alkali-soluble, inert matrix for the crosslinking agents and initiator molecules. Examples which may be mentioned are copolymers made from maleimide and styrene or 3,5-disubstituted poly-4-hydroxystyrenes. Alternatively, reactive and inert binders can also be used mixed with one another in order to achieve optimum properties.

The binders employed in the mixture according to the invention are insoluble in water, but soluble in aqueous alkaline media and in organic solvents. This is achieved by the incorporation of functional groups whose $pK_a$ is less than about 12, preferably between 6 and 10. Typical examples arephenols, carboxylic acids, but also sulfonamides, sulfonylurethanes and imides.

Phenolic resins of the novolak type are preferably employed, for example phenol-formaldehyde resins, cresol-formaldehyde resins, cocondensates and mixtures thereof, and condensates of phenol or cresol with other aldehydes.

In addition, it is also possible to employ: polymers of styrene with alkenylsulfonyl-aminocarbonyloxy or cycloalkenylsulfonyl-aminocarbonyloxy units (EP-A-0,184,804), polymers of acrylic acid, methacrylic acid, maleic acid, itaconic acid etc., optionally containing lateral crosslinking —$CH_2OR$ groups (EP-A-0,184,044), polymers made of vinyl monomers and alkenylphenol units (EP-A-0,153,682), polyvinylphenols (DE-C-2,322,230), polymeric binders containing lateral, phenolic hydroxyl groups (EP-A-0,212,439 and 0,212,440), styrene-maleic anhydride copolymers (DE-A-3,130,987), polymers made from unsaturated (thio)phosphinic acid iso(thio)cyanates with a polymer containing active hydrogen (DE-A-3,615,612 and 3,615,613), polymers containing vinyl acetate, vinyl alcohol and vinyl acetal units (EP-A-0,216,083), and poly(vinyl acetals) containing units of hydroxyaldehydes (DE-A-3,644,162).

The amount of binder is generally about 1 to 90, in particular 5 to 90% by weight, preferably 50 to 90% by weight, relative to the total weight of the radiation-sensitive mixture.

Dyes, pigments, plasticizers, wetting agents and flow control agents, but also polyglycols and cellulose ethers, for example ethylcellulose, may optionally be added to the radiation-sensitive mixtures according to the invention in order to improve specific properties, such as flexibility, adhesion and gloss.

The radiation-sensitive mixture according to the invention is preferably dissolved in solvents, such as ethylene glycol, glycol ethers, such as glycol monomethyl ether, glycol dimethyl ether, glycol monoethyl ether or propylene glycol monoalkyl ethers, in particular propylene glycol methyl ether; aliphatic esters, such as ethyl acetate, hydroxyethyl acetate, alkoxyethyl acetate, n-butyl acetate, propylene glycol monoalkyl ether acetate, in particular propylene glycol methyl ether acetate, or amyl acetate; ethers, such as dioxane, ketones, such as methyl ethyl ketone, methyl isobutyl ketone, cyclopentanone and cyclohexanone; dimethylformamide, dimethylacetamide, hexamethylphosphoricamide, N-methylpyrrolidone, butyrolactone, tetrahydrofuran, or in mixtures thereof. Glycol ethers, aliphatic esters and ketones are particularly preferred.

The solutions produced using the components of the radiation-sensitive mixture generally have a solids content of about 5 to 60% by weight, preferably up to 50% by weight.

A radiation-sensitive recording material, comprising a substrate and the radiation-sensitive mixture applied thereto, is furthermore claimed according to the invention.

Suitable substrates are all materials from which capacitors, semiconductors, multilayered printed circuits or integrated circuits are made or from which they can be produced. In particular, surfaces which are made of pure, thermally oxidized and/or aluminum-coated silicon and may optionally also be doped may be mentioned, including all other substrates which are customary in semiconductor technology, such as, for example, silicon nitride, gallium arsenide and indium phosphide. In addition, the substrates which are known from the manufacture of liquid-crystal displays, such as glass and indium/tin oxide; furthermore metal plates and foils, for example made of aluminum, copper or zinc; bimetallic and trimetallic foils, but also electrically nonconductive foils which are vapour-coated with metals, optionally aluminum-coated $SiO_2$ materials and paper, are suitable. These substrates may be subjected to thermal pretreatment, may be superficially roughened or etched or treated with chemicals in order to improve desired properties, such as, for example, to increase hydrophilicity.

In a particular embodiment, the radiation-sensitive mixture can contain an adhesion promoter for better adhesion, either in the resist itself or between the resist and the substrate. In the case of silicon or silicon dioxide substrates, adhesion promoters of the aminosilane type, for example, 3-aminopropyltriethoxysilane or hexamethyldisilazane, are suitable for this purpose.

Examples of substrates which can be used for the production of printing forms for letterpress printing, planographic printing, screen printing and rotogravure printing, and for the production of relief copies, are aluminum plates, optionally anodically oxidized, roughened and/or silicated aluminum plates, zinc plates, steel plates which have optionally been chrome-plated, and plastic films or paper.

The recording material according to the invention is irradiated imagewise with high-energy radiation sources; electron, X-ray radiation and, in particular, short-wave UV radiation is preferred.

The coating thickness varies with its field of use and is between about 0.1 and 100 μm, in particular between 1 and 10 μm.

The radiation-sensitive mixture can be applied to the substrate by spraying, flow coating, roller application, spin coating or dip coating. The solvent is then removed by evaporation, leaving the radiation-sensitive coating on the surface of the substrate. The removal of the solvent can be accelerated, if necessary, by heating the coating to temperatures of up to 150° C. However, it is also possible initially to apply the mixture in the above-mentioned manner to an intermediate substrate, from which it is transferred onto the final substrate material under pressure and elevated temperature. The intermediate substrates used may, in principle, be any materials mentioned as substrate materials, so long as they are flexible. The coating is subsequently irradiated image-wise. High-energy radiation, such as x-ray or electron radiation is preferred. High-energy synchrotron radiation having doses from about 20 to 200 $mJ/cm^2$ or radiation from an electron-beam writer, is particularly preferred. The actual differentiation reaction (crosslinking) can in some cases take place at room temperature. In general, however, subsequent heating (post-exposure bake) which can last about 1 to 30 minutes and can preferably take place at temperatures of from about 90° to 150° C. is favorable. In the radiation-sensitive coating, an image pattern is subsequently bared by development by treating the coating with a developer solution which dissolves or removes the irradiated regions of the material.

The developers used are solutions of alkaline reagents, such as silicates, metasilicates, hydroxides, hydrogen phosphates, dihydrogenphosphates, carbonates or hydrogen carbonates, in particular of alkali metal ions or ammonium ions, but also ammonia and organic ammonium bases and the like. The content of these substances in the developer solution is generally about 0.1 to 15% by weight, preferably 0.5 to 5% by weight, relative to the weight of the developer solution.

The preparation of the aromatic chlorine- or bromine-containing compounds present in the radiation-sensitive mixture according to the invention, some of which are new, is illustrated with reference to the examples below.

The amounts are usually expressed in parts by weight (PW), mixing ratios and percentages are in parts by weight, unless otherwise stated.

Preparation Example 1

O-2,2,2-trichloroethyl N-(4-hydroxyphenyl)carbamate 4.3 g (0.02 mol) of 2,2,2-trichloroethyl chloroformate are dissolved in 20 ml of DMF and added dropwise to a solution of 10.9 g (0.1 mol) of 4-hydroxyaniline in 100 ml of DMF. After the mixture has been stirred for a further hour at room temperature, it is poured into ice water, acidified and filtered with suction, and the material filtered off is washed with water. The product is recrystallized from toluene using activated charcoal.

2.3 g of a substance of melting point 134° C. are obtained; $^1$H NMR: —NH—9.17 ppm (s, 1H), —CH$_2$—4.9 ppm (s, 2H), —OH (+H$_2$O) 3.31 ppm (s) , aromatics 6.67 ppm (d, 2H) 7.27 ppm (d, 2H).

Preparation Example 2

N-trichloroacetyl-N'-3-hydroxypropylurea 3.75 g of 3-aminopropanol are dissolved in a mixture of 10 g of water and 10 g of acetone. 9.4 g of trichloroacetyl isocyanate are subsequently added dropwise. After a slightly exothermic reaction, the mixture is stirred for 1 hour at room temperature, then refluxed for 2.5 hours. Concentration in a rotary evaporator gives 7.7 g of an oily phase, which is taken up in acetone and subjected to column chromatography on silica gel using cyclohexane/ethyl acetate (1:1) as eluent.

4.3 g of an oil are obtained; $^1$H—NMR: —NH—7.7 ppm (broad), —CH$_2$—3.80 (t, 2H), 3.52 (q, 2H), 1.84 ppm (p, 2H) , —OH 2.64 ppm ( s, 1H).

Preparation Example 3

O-phenyl N-trichloroacetylcarbamate 4.7 g (0.05 mol) of phenol are dissolved in a mixture of 10 g of water and 10 g of acetone. 9.4 g (0.05 mol) of trichloroacetyl isocyanate are subsequently added dropwise over the course of 30 minutes. The mixture is stirred at room temperature for 30 minutes and under reflux for 2.5 hours. The solvent mixture is evaporated in a rotary evaporator, and the solid obtained is recrystallized from DMSO.

6.1 g of a substance of melting point 148° C. are obtained; $^1$H NMR: signals at about 8 ppm.

Preparation Example 4

Ethyl 4-bromo-3-oxobutyrate 32.5 g (0.25 mol) of ethyl acetoacetate are dissolved in 64 ml of glacial acetic acid. 40 g (0.25 mol) of bromine are added dropwise to the cooled solution. The mixture is left to stand overnight and then poured into cold water. The oil obtained is washed with water, dried and distilled in a glass filter pump vacuum.

The fine distillation is carried out at 0.08 mmHg, where the boiling point is 53° C. $^1$H NMR: —CH$_3$ 1.28 ppm (t, 3H), —CH$_2$—4.20 ppm (ester, q, 2H), and signals at 12.0 ppm, 3.70 ppm, 4.05 ppm and 4.16 ppm.

Preparation Example 5

Ethyl 2-chloro-3-oxo-butyrate 32.5 g (0.25 mol) of ethyl acetoacetate are dissolved in 64 ml of methylene chloride. 33.74 g (0.25 mol) of sulfuryl chloride are added dropwise to this solution, and the mixture is then (when the evolution of gas is complete) heated at a gentle boil for one hour. After the methylene chloride has been removed by distillation, the residue is distilled at 86°–92° C./12 mmHg. 38.8 g of substance are obtained, $^1$H NMR: —CH$_3$ 1.31 ppm (t, 3H), —CH$_2$—(ester) 4.28 ppm (q, 2H), —CH$_3$ (acetyl) 2.38 ppm (s, 3H), —CHCl—4.76 ppm (s, 1H).

Preparation Example 6

4-trichloroacetylphenol 13.86 g of AlCl$_3$ and 10.7 ml of chlorobenzene are introduced into a flask at 5° C. A solution of 5.06 g of phenol in 5.4 ml of chlorobenzene is added dropwise at 5° C., and 8 ml of trichloroacetonitrile are subsequently added dropwise, also at this temperature. The mixture is warmed to 60° C. while passing HCl into the flask, and stirring is continued until a clear solution has been produced. The mixture is subsequently stirred at 60° C. for a further 65 hours, the product is poured onto ice and extracted with ether, and the ether phase is washed, dried using sodium sulfate and evaporated.

Vacuum distillation at 0.1 mm Hg gives a boiling point of 140° C.; $^1$H NMR: —OH 6.2 ppm (broad, s) , aromatics: 6.95 ppm (d, 2H) and 8.24 ppm (d, 2H).

Preparation Example 7

1,1,1-Trichloroacetylacetone a) Precursor: 1,1,1-trichloro-2-amino-2-penten-4-one (by the method of M. Coenen et al, J. Prakt. Chem. (4) 27, 239 (1965))

50 g (0.5 mol) of acetylacetone and 70 g (0.5 mol) of trichloroacetonitrile are dissolved in 200 ml of methanol. 100 ml of saturated sodium acetate solution are added dropwise at 20°–30° C. During this addition, the reaction mixture becomes yellow and the temperature increases to 60° C. The mixture is stirred for two hours and then stirred into 2 l of water, and the oily product which deposits gradually becomes solid. It is filtered off with suction, dried and recrystallized from hexane.

85 g of a substance of melting point 67° C. are obtained; $^1$H NMR: —CH$_3$ 2.19 ppm (s), —CH=5.9 ppm (t, 1H), —NH$_2$ 7–8.5 ppm (broad, 2H).

b) 1,1,1-Trichloroacetylacetone (by the method of C. Ringel, R. Mayer, J. Prakt. Chem. (4) , 26, 333 (1964)) 50 g of 1,1,1-trichloro-2-amino-2-penten-4-one are stirred at room temperature with 100 ml of concentrated hydrochloric acid, during which ammonium chloride and the target compound deposit with slight warming. After two hours, 80 ml of water are added. The oily layer is separated off and taken up in 150 ml of ether, the ether solution is dried over sodium sulfate and evaporated on a rotary evaporator, and the residue is distilled at 0.15 mmHg and 46° C.

31 g of an oil are obtained; $^1$H NMR: —CH$_3$ 2.19 ppm (s, 3H), —CH=6.11 ppm ( s 1H), —OH 13.6 ppm (broad, 1H). The compound is present to about 94% in the enol form (in CDCl$_3$ at room temperature), and the keto form exhibits signals at: —CH$_3$ 2.34 ppm and CH$_2$—4.10 ppm (ratio 3:2).

Preparation Example 8

ω,ω,ω-Trichlorobenzoylacetone a) Precursor:

1,1,1-Trichloro-2-amino-4-phenyl-4-oxo-2-butene (by the method of M. Coenen et al, J. Prakt. Chemie (4) 27, 248 (1965))

The compound is prepared analogously to the preparation of the precursor from Preparation Example 7, with the difference that the acetylacetone is replaced by benzoylacetone.

A product having a melting point of 104½ C. is obtained. (Lit.: 102°–103½ C.). $^1$H NMR: —CH=6.63 ppm (t, 1H), aromatics and —NH$_2$ 7–8.2 ppm (7H).

b) ω, ω, ω-Trichlorobenzoylacetone (by the method of C. Ringel, R. Mayer, J. Prakt. Chemo (4), 26, 333 (1964))

The procedure followed is analogous to Preparation Example 7, with the difference that a benzoyl-substituted compound is employed in place of the acetyl-substituted compound.

An oil is obtained having a boiling point of 112° C./0.2 mm (Lit.: 102° C./0.09 mmHg). $^1$H NMR: —CH=(enol form) 6.80 ppm (s, 1H), —OH 14.25 ppm (s, 1H), aromatics 7.3–8.0 ppm (5H). The keto form is present to the extent of about 15% in CDCl$_3$ at room temperature and gives a —CH$_2$— at 7.25 ppm (s).

Preparation Example 9

Methyl 4,4,4-trichloroacetoacetate a) Precursor:

Methyl 3-amino-4,4,4-trichlorocrotonate (by the method of M. Coenen et al, J. Prakt. Chem. (4) 27, 239 (1965))

The procedure followed is analogous to the precursor for Preparation Example 8, with the difference that benzoylacetone is replaced by methyl acetoacetate.

A crystalline solid having a melting point of 54° C. is obtained. (Lit.: 53°–54° C.), $^1$H NMR: —CH$_3$ 3.71 ppm (s, 3H), —CH=5.51 ppm (t, 1H), —NH$_2$ 6–7 ppm (broad, 2H).

b) Methyl 4,4,4-trichloroacetoacetate (by the method of C. Ringel, R. Mayer, J. Prakt. Chem. (4), 26, 333 (1964))

The procedure followed is as in Preparation Example 8, but with the difference that ethyl aminocrotonate is employed in place of benzoylbutenone.

A substance is obtained having a boiling point of 60° C./0.1 mmHg; $^1$H NMR: —CH$_3$ 3.80 ppm (s, 3H), —CH$_2$— 4.04 ppm (s, 2H). The product is present in the enol form to the extent of about 15% in CDCl$_3$ at room temperature, the enol form exhibiting the following NMR signals: —CH=7.29 ppm (s), —OH 12.45 ppm (s).

The use examples below are intended to illustrate the invention in greater detail, but do not represent a limitation. In the examples, "PW" stands for "parts by weight", and percentages indicate percent by weight, unless otherwise stated.

Application Example 1

A coating solution was prepared from

17 PW of cresol-formaldehyde novolak having a softening range of 105°–120° C.,

4 PW of O-2,2,2-trichloroethyl N-(4-hydroxyphenyl)-carbamate,

5 PW of poly(alkoxymethyl)melamin; mixed C$_1$ and higher alkoxy groups (Cymel 1116, Cyanamid) and 74 PW of propylene glycol monomethyl ether acetate.

The solution was spin-coated at 5000 rpm onto a silicon wafer which had been treated with an adhesion promoter (hexamethyldisilazane). After drying at 110° C. for 2 minutes on a hot plate, a coating thickness of 1 μm was obtained. Imagewise irradiation was carried out using synchrotron radiation (BESSY, Berlin, 754 MeV) through a gold-on-silicon mask at a dose of 150 mJ/cm$^2$. The experimental arrangement can be found in A. Heuberger, "X-Ray Lithography", Microelectronic Engineering 3, 535–556 (1985). After exposure, the resist coating was warmed at 105° C. for 3 minutes and subsequently developed for 60 seconds in the commercially available ®AZ developer (1 part of developer and 1 part of demineralized water).

A flaw-free image containing all details of the mask was obtained, lines and trenches of 0.3 μm also being reproduced without flaws. The resist edges were not negatively eroded and exhibited angles of virtually 90° in a scanning electron microscope. Scumming was not observed.

Application Examples 2 to 11

Coating solutions were prepared analogously to Application Example 1 using 75 PW of propylene glycol monomethyl ether acetate as solvent. The solids content of 25% by weight is divided up in accordance with the % by weight data of the individual components from Table I.

The binder used was, for example, the novolak resin from Application Example 1, the radiation sources were synchrotron radiation (BESSY, Berlin, 754 MeV) and the developer was the commercially available 0.3N ®AZ developer. Table I collates the results, in particular the development times necessary, and, unless otherwise stated, a post-exposure bake at 105° C. for 3 minutes on a hot plate is carried out after exposure.

TABLE I

| Applic. Example | Binder (70% by weight) | Initiator (12% by weight) | Crosslinking agent (18% by weight) | Irradiation dose (mJ/cm$^2$) | Development time (sec) |
|---|---|---|---|---|---|
| 2 | Novolak resin of Applic. Example 1 | N-trichloro-acetyl-N'-hydroxypropyl-urea (PE2) | Cymel 1116 | 200 | 120 |
| 3 | Novolak resin of Applic. Example 1 | O-phenyl N-trichloro-acetylcarbamate (PE3) | " | 120 | 55 |
| 4 | Novolak resin of Applic. | Ethyl 4-bromo-3-oxobutyrate (PE4) | " | 200 | 100 |
| 5 | Novolak resin of Applic. Example 1 | Ethyl 2-chloro-3-oxobutyrate (PE5) | " | 150 | 85 |
| 6 | Novolak resin of Applic. Example 1 | 4-Trichloroacetyl-phenol (PE6) | " | 120 | 65 |
| 7 | Novolak resin of Applic. Example 1 | 1,1,1-Trichloro-acetylacetone (PE7) | " | 150 | 90 |

TABLE I-continued

| Applic. Example | Binder (70% by weight) | Initiator (12% by weight) | Crosslinking agent (18% by weight) | Irradiation dose (mJ/cm$^2$) | Development time (sec) |
|---|---|---|---|---|---|
| 8 | Novolak resin of Applic. Example 1 | ω,ω,ω-Trichloro-benozylacetone (PE8) | Cymel 1116 | 175 | 120 |
| 9 | Novolak resin of Applic. Example 1 | Methyl 4,4,4-trichloroaceto-acetate (PE9) | " | 150 | 100 |
| 10 | Novolak resin of Applic. Example 1 | 4-Trichloro-acetylphenol (PE6) | Grinolit RV 1815 (EMS-Chemie) | 180 | x) |
| 11 | 80% by weight of a copolymer made from 84 parts of pyrocatechol monomethacrylate and 16 parts of N-methoxymethyl-methacrylamide | 20% by weight of 4-trichloro-acetylphenol (PE6) | — | 180 | xx) | x) After exposure, the material was heated for 3 minutes at 120° C. on a hot plate and then developed for 50 seconds in a 0.6 AZ developer.
xx) After exposure, the material was heated for 3 minutes at 130° C. on a hot plate and then developed for 25 seconds in a 0.6 AZ developer.

In all the Use Examples, good structural transfer was achieved at the short development times indicated. Scumming was not observed.

Application Examples 12 to 14 (comparison examples)

For comparison, coating solutions were prepared analogously to Application Examples 2 to 11, but using initiator compounds which, although in some cases containing aliphatic halogen, did not correspond to the initiator compounds used according to the invention, i.e. did not have groups in the molecule capable of producing a pK$_a$ value of less than 12.

Application Example 12 (C)

A coating solution was prepared analogously to Applic. Example 1, but with the difference that the initiator employed was triphenylsulfonium hexafluorophosphate (sulf). Even using undiluted ®AZ developer (0.6N), the development time was 600 seconds.

Application Example 13 (C)

A coating solution was prepared from
20 PW of the novolak from Application Example 1,
3.4 PW of 2,2-bis-(4-chlorophenyl)-1,1,1-trichloroethane (DDT)
5.1 PW of Cymel 1116 in
71.5 PW of propylene glycol monomethyl ether acetate.

Drying was carried out at 110° C. for 1 minute on a hot plate. Exposure with 30 mJ/cm$^2$ (radiation see Application Example 1) and subsequent post-exposure bake for 3 minutes at 105° C. gave a resist film which could not be developed at the unexposed points even after 30 minutes in 0.6N AZ developer.

Application Example 14 (C)

The procedure was analogous to Application Example 13, but the proportion of DDT was reduced to 0.6 PW. In this case, although development was possible using a 0.6 N ®AZ developer, a development time of 1,080 seconds was required.

What is claimed is:

1. A radiation-curable mixture which can be cured by means of high-energy radiation, which comprises about 0.5 to 50% by weight of a compound which forms an acid under the action of high-energy radiation, and an acid-curable substance in an amount sufficient to decrease the solubility of the mixture upon exposure to actinic radiation, wherein the compound which forms an acid contains at least one aliphatically bound chlorine or bromine atom and has a pK$_a$ value of less than about 12, and is developable in aqueous-alkaline developer solutions.

2. A radiation-curable mixture as claimed in claim 1, wherein said acid-forming compound has a pK$_a$ value of from 6 to 10.

3. A radiation-curable mixture as claimed in claim 1, wherein said acid-forming compound contains at least one functional group selected from the group consisting of a phenolic OH group, an aliphatic OH group having strongly electron-withdrawing substituents in the vicinity, an aromatic SH group, an aliphatic or aromatic sulfonamide group, an aliphatic or aromatic imide group, an N-acyl-substituted carbamate group, an N-acyl-substituted carbamide group or a CH-acidic group.

4. A radiation-curable mixture as claimed in claim 3, wherein said acid-forming compound contains a phenolic OH group, an imide group, an N-acyl-substituted carbamate group, an N-acyl-substituted carbamide group or a CH-acidic group.

5. A radiation-curable mixture as claimed in claim 1, wherein said chlorine or bromine atom is bound to an sp$^3$-hybridized carbon atom.

6. A radiation-curable mixture as claimed in claim 5, wherein said acid-forming compound contains a chlorinated or brominated acetyl group.

7. A radiation-curable mixture as claimed in claim 1, wherein said acid-forming compound does not contain a hydrogen atom in the α-position to a carbon atom carrying chlorine or bromine substituents.

8. A radiation-curable mixture as claimed in claim 7, wherein said acid-forming compound contains a chlorinated or brominated acetyl group.

9. A radiation-curable mixture as claimed in claim 1, wherein said acid-forming compound contains a chlorinated or brominated tert.-butyl group.

10. A radiation-curable mixture as claimed in claim 1, wherein said acid-forming compound, on the α-carbon atom to at least one said chlorine- or bromine-substituted carbon atom, does not carry any hydrogen atoms in the trans-position to the chlorine or bromine atom.

11. A radiation-curable mixture as claimed in claim 1, wherein said acid-forming compound, in addition to at least one aliphatically bound chlorine or bromine atom, also contains at least one aromatically bound chlorine or bromine atom.

12. A radiation-curable mixture as claimed in claim 11, wherein said at least one aromatically bound chlorine or bromine atom is in the o-position to a phenolic OH group.

13. A radiation-curable mixture as claimed in claim 1, wherein the substituent containing aliphatically bound bromine or chlorine is bound to an alkali-soluble polymer.

14. A radiation-curable mixture as claimed in claim 1, further comprising an alkali-soluble binder.

15. A radiation-curable mixture as claimed in claim 1, consisting essentially of the recited ingredients.

* * * * *